United States Patent
Kondo

(10) Patent No.: US 7,202,728 B2
(45) Date of Patent: Apr. 10, 2007

(54) SIGNAL TRANSMISSION CIRCUIT

(75) Inventor: Toru Kondo, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/054,957

(22) Filed: Feb. 11, 2005

(65) Prior Publication Data

US 2005/0184763 A1    Aug. 25, 2005

(30) Foreign Application Priority Data

Feb. 19, 2004  (JP)  ............................. 2004-043565

(51) Int. Cl.
*G11C 19/00*  (2006.01)
(52) U.S. Cl. ..................................... 327/389; 327/390
(58) Field of Classification Search ................ 327/108, 327/389, 390; 377/78, 79; 345/100
See application file for complete search history.

(56) References Cited

U.S. PATENT DOCUMENTS

| 5,790,090 | A | * | 8/1998 | Libsch et al. .................. 345/94 |
| 5,859,630 | A | * | 1/1999 | Huq ............................ 345/100 |
| 5,870,071 | A | * | 2/1999 | Kawahata .................... 345/100 |
| 5,949,398 | A | * | 9/1999 | Kim ............................ 345/100 |
| 6,483,889 | B2 | * | 11/2002 | Kim et al. .................... 377/54 |

FOREIGN PATENT DOCUMENTS

| JP | 3-75960 | 12/1991 |
| JP | 5-84967 | 12/1993 |

* cited by examiner

*Primary Examiner*—Kenneth B. Wells
(74) *Attorney, Agent, or Firm*—Westerman, Hattori, Daniels & Adrian, LLP.

(57) ABSTRACT

The signal transmission circuit comprises a first switch controls output according to a first control pulse, the first source follower outputting signals to the first output line based on signal input into the gate, a first capacitor connected between the gate and the source of the source follower, the first circuit, based on a level of the input signal, fixing the first output line to reference potential, the second switch controlling output according to a second control pulse, the second source follower, according to signals input into the gate, supplying output signals to the subsequent stage and also to a second output line, a second capacitor connected between the gate and the source of the source follower, and the second circuit, based on a level of input signals from the source, fixing the second output line to reference potential.

10 Claims, 13 Drawing Sheets

SIGNAL TRANSMISSION CIRCUIT

BACKGROUND OF THE INVENTION

1. Field of the Invention

The present invention relates to a signal transmission circuit that is favorably used in shift registers that drive solid-state imaging apparatuses, liquid crystal displays, memory devices, and the like.

Priority is claimed on Japanese Patent Application No. 2004-043565, filed Feb. 19, 2004, the contents of which are incorporated herein by reference.

2. Description of Prior Art

FIG. 11 shows a portion of a signal transmission circuit that is disclosed in Japanese Patent Application Publication (JP-B) No. 3-75960 as an example of a conventional signal transmission circuit that is composed solely of NMOS transistors.

As is shown in FIG. 11, an input line $\phi_{ST}$ is connected to a gate of a MOS transistor M2 via a MOS transistor M1, and to a ground line GND via a MOS transistor M3. A bootstrap capacitor C1 is connected between the gate and source of the MOS transistor M2, and the source of the MOS transistor M2 is connected to a gate of a MOS transistor M52 via a MOS transistor M51.

The source of the MOS transistor M2 is connected to the ground line GND via a MOS transistor M4 and a MOS transistor M53. A bootstrap capacitor C51 is connected between the gate and source of the MOS transistor M52. The source of the MOS transistor M52 is connected to the ground line GND via a MOS transistor M14, and the source of the MOS transistor M52 is connected to the subsequent circuit.

A clock line $\phi_1$ is connected to the gate of the transistors M1 and M4 and to the drain of the transistor M52, and a clock line $\phi_2$ is connected to the gate of the transistors M51 and M14 and to the drain of the transistor M2. Thereafter, these transistor and bootstrap capacitor circuits are repeatedly connected in sequence. In addition, OUT1, OUT2 . . . are output lines, G2, G52 . . . are gate lines of the transistors M2 and M52, $Cs_1$ is a parasitic capacitor that does not contribute to the bootstrap effect that is applied to G2, G52 . . . , $C_{DG}$ is a capacitor between a drain and a gate, and $C_L$ is an output capacitor.

FIG. 12 is a timing chart for schematically describing an operation of the signal transmission circuit shown in FIG. 11. The signals shown by $\phi_1$, $\phi_2$, and $\phi_{ST}$ in FIG. 12 are applied respectively to the clock lines $\phi_1$ and $\phi_2$ and to the input line $\phi_{ST}$ in the circuit shown in FIG. 11, and, in FIG. 11, GND is a ground potential. Here, potentials of high level of the input signal $\phi_{ST}$ and the clock signals $\phi_1$ and $\phi_2$ are defined as $V_H$, and potential of all threshold values of the MOS transistors are defined as $V_{th}$.

In FIG. 12, firstly, when the input signal $\phi_{ST}$ and the clock signal $\phi_1$ change to a high level, the transistor M1 is in a conducting state. Consequently, the high level of the input signal $\phi_{ST}$ is sent to the transistor M1, and charge is accumulated in the bootstrap capacitor $C_1$. As a result, as is shown by $V_{G2}$ in FIG. 12, the potential of the gate line G2 of the transistor M2 changes to a high level. At this time, if potential of the gate line G2 of the transistor M2 is taken as $V_H'$, the Formula 1 below applies.

$$V_H' = V_H - V_{th} \quad \text{(Formula 1)}$$

When the potential $V_{G2}$ of the gate line G2 of the transistor M2 changes to a high level, the transistor M2 is in a conducting state. As a result, as is shown by $V_{OUT1}$ in FIG. 12, a low level of the clock signal $\phi_2$ is output to the output line OUT1.

Next, when the clock signal $\phi_2$ changes to a high level, the potential $V_{G2}$ of the gate line G2 of the transistor M2 rises by Formula 2 via the bootstrap capacitor $C_1$.

$C_{S1}$ is a parasitic capacitor that does not contribute to the bootstrap effect and that is caused by the gate of the transistor M2.

As a result, the potential $V_{G2}$ of the gate line G2 of the transistor M2 changes to Formula 3, and, at this time, if the relationship shown in Formula 4 applies, the high level of the clock signal $\phi_2$ is extracted to the source of the transistor M2.

$$V_A = \{C_1/(C_1+C_{S1})\}V_H \quad \text{(Formula 2)}$$

$$V_{G2} = V_H' + \{C_1/(C_1+C_{S1})\}V_H \quad \text{(Formula 3)}$$

$$V_{G2} - V_{th} \geq V_H \quad \text{(Formula 4)}$$

Accordingly, as is shown by the $V_{OUT1}$ in FIG. 12, the high level is extracted to the output line OUT1. At this time, simultaneously, in synchronization with the clock signal $\phi_2$, the transistor M51 is placed in a conducting state. As a result, because a load is accumulated in the bootstrap capacitor C51, the potential of the gate line G52 of the transistor M52 changes to a high level, as is shown by the $V_{G52}$ in FIG. 12.

Next, when the clock signal $\phi_1$ once again changes to a high level, the potential $V_{G52}$ of the gate line 52 of the transistor M52 is lifted to a higher voltage than the high level potential $V_H$ of the clock signal $\phi_1$ via the bootstrap capacitor C51. As a result, the high level of the clock signal $\phi_1$ is extracted to the source of the transistor M52, and the high level is extracted to the output line OUT2, as is shown by the $V_{OUT2}$ in FIG. 12.

In the same way, the potentials of the gate line G102 and the output line OUT3, and the potentials of the gate line 152 and the output line OUT4 that are shown in FIG. 11 change respectively in the manners shown by $V_{G102}$, $V_{OUT3}$, $V_{G152}$, and $V_{OUT4}$ shown in FIG. 12. Accordingly, in this circuit, high level of the input signal $\phi_{ST}$ are sequentially transmitted, and the high level is extracted in sequence to the output lines OUT1, OUT2, OUT3, and OUT4.

FIG. 13 is a portion of a signal transmission circuit disclosed in Japanese Patent Application Publication (JP-B) No. 5-84967 as an example of a conventional signal transmission circuit that is composed solely of NMOS transistors.

An input line $\phi_{ST}$ is connected to a gate of the MOS transistor M2 and to the gate of the MOS transistor M12 via the MOS transistor M1, and the bootstrap capacitor C1 is connected between the gate and source of the MOS transistor M2.

The source of the MOS transistor M2 is connected to the gate of the MOS transistor M52 and to the gate of a MOS transistor M62 via a MOS transistor M51. The source of the MOS transistor M2 is also connected to a ground line GND via a MOS transistor M13, and the bootstrap capacitor C51 is connected between the gate and source of the MOS transistor M52.

The source of the MOS transistor M52 is connected to the ground line GND via a MOS transistor M63, and the source of the MOS transistor M52 is connected to the next circuit. Furthermore, a clock line $\phi_1$ is connected to the gates of the MOS transistors M1 and M11, and to the drain of the MOS transistor M52. A clock line $\phi_2$ is connected to the gates of the MOS transistors M51 and M61, and to the drain of the MOS transistor M2.

In addition, the drains of the MOS transistors M11 and M61 are connected to a power supply line $V_{DD}$, and the sources of the MOS transistors M11 and M61 are connected respectively to the gates of the transistors M13 and M63 and to the drains of the MOS transistors M12 and M62. The sources of the MOS transistors M12 and M62 are connected to the ground line GND, and, thereafter, these transistor and bootstrap capacitor circuits are repeatedly connected in sequence. Here, OUT1, OUT2 . . . are output lines, G2, G52 . . . are gate lines of the transistors M2 and M52, $C_{S1}$ is a parasitic capacitor that does not contribute to the bootstrap effect and that is applied to G2, G52 . . . , $C_{S2}$ is a parasitic capacitor that does not contribute to the bootstrap effect and that is caused by the gates of the transistors M12 and M62 . . . , and 10, 60, 110, and 160 are output line fixing circuits.

Next, using timing chart shown in FIG. 14, an operation of the signal transmission circuit shown in FIG. 13 will be schematically described.

The signals shown by $\phi_1$, $\phi_2$, and $\phi_{ST}$ in FIG. 14 are applied respectively to the clock lines $\phi_1$ and $\phi_2$ and to the input line $\phi_{ST}$ in the circuit shown in FIG. 13, and, in FIG. 13, GND is a ground potential.

Here, potentials of high level of the input signal $\phi_{ST}$ and the clock signals $\phi_1$ and $\phi_2$ are defined as $V_H$, and all threshold values of the MOS transistors are defined as $V_{th}$.

Firstly, when the input signal $\phi_{ST}$ and the clock signal $\phi_1$ change to a high level, the transistor M1 changes to a conducting state. Consequently, the high level of the input signal $\phi_{ST}$ is sent to the transistor M2, and a charge is accumulated in the bootstrap capacitor $C_1$. As a result, as is shown by $V_{G2}$ in FIG. 14, the potential of the gate line G2 of the transistor M2 changes to a high level. At this time, if the potential of the gate line G2 of the transistor M2 is taken as $V_H'$, the Formula 5 below applies.

$$V_H' = V_H - V_{th} \quad \text{(Formula 5)}$$

When the potential $V_{G2}$ of the gate line G2 of the transistor M2 changes to a high level, the transistor M2 is placed in a conducting state. As a result, as is shown by $V_{OUT1}$ in FIG. 14, a low level of the clock signal $\phi_2$ is output to the potential $V_{OUT1}$ of the output line OUT1. At this time, because the transistor M12 is also in a conducting state, as is shown by $V_{G13}$ in FIG. 14, the potential of the gate line G13 of the transistor M13 becomes the ground potential, and the transistor M13 changes to a cutoff state.

Next, when the clock signal $\phi_2$ changes to a high level, the potential $V_{G2}$ of the gate line G2 of the transistor M2 rises by Formula 6 via the bootstrap capacitor $C_1$.

$C_{S1}$ and $C_{S2}$ are parasitic capacitors that do not contribute to the bootstrap effect and that is caused respectively by the gates of the transistors M2 and M12.

As a result, the potential $V_{G2}$ of the gate line G2 of the transistor M2 changes to Formula 7, and if the relationship shown in Formula 8 applies, the high level of the clock signal $\phi_2$ is extracted to the source of the transistor M2. At this time, because the potential $V_{G13}$ of the gate line G13 of the transistor M13 is continuously fixed to the ground potential, the transistor M13 remains fixed in the cutoff state, and is cut off from the output line OUT 1. Therefore, there are no harmful effects on the output line OUT 1. Accordingly, the high level is extracted to the output line OUT1, as is shown by $V_{OUT1}$ in FIG. 14.

$$V_A = \{C_1/(C_1+C_{S1}+C_{S2})\}V_H \quad \text{(Formula 6)}$$

$$V_{G2} = V_H' + \{C_1/(C_1+C_{S1}+C_{S2})\}V_H \quad \text{(Formula 7)}$$

$$V_{G2} - V_{th} \geq V_H \quad \text{(Formula 8)}$$

At this time, simultaneously, in synchronization with the clock signal $\phi_2$, the transistor M51 is placed in a conducting state. As a result, because a load is accumulated in the bootstrap capacitor C51, the potential of the gate line G52 of the transistor M52 changes to a high level, as is shown by the $V_{G52}$ in FIG. 14.

Next, when the clock signal $\phi_1$ once again changes to a high level, the potential $V_{G52}$ of the gate line 52 of the transistor M52 is lifted to a higher potential than the high level potential $V_H$ of the clock signal $\phi_1$ via the bootstrap capacitor C51. As a result, the high level of the clock signal $\phi_1$ is extracted to the source of the transistor M52. Accordingly, the high level is extracted to the potential of the output line OUT2, as is shown by the $V_{OUT2}$ in FIG. 14.

Note that, at this time, because the input signal $\phi_{ST}$ is at a low level, the potential $V_{G2}$ of the gate line G2 of the transistor M2 changes to a low level, and the transistor M12 changes to a cutoff state. In contrast, because the transistor M11 is in a conducting state, the potential $V_{G13}$ of the gate line G13 of the transistor M13 changes to a high level. As a result, because the transistor M13 is in a conducting state, the potential $V_{OUT1}$ of the output line OUT1 is fixed to the ground potential.

In the same way, the potentials of the gate line G102 of the transistor M102, the gate line G113, the output line OUT3, the gate line 152, the gate line 163 of the transistor M163, and the output line OUT 4 as are shown in FIG. 13, change respectively in the manners shown by $V_{G102}$, $V_{G113}$, $V_{OUT3}$, $V_{G152}$, $V_{G163}$, and $V_{OUT4}$ shown in FIG. 14.

Accordingly, in this circuit, the high level of the input signal $\phi_{ST}$ are sequentially transmitted, and the high level are extracted in sequence to the output lines OUT1, OUT2, OUT3, and OUT4.

SUMMARY OF THE INVENTION

The first aspect of the present invention is a signal transmission circuit comprising: a first switch element connecting an input terminal which a start signal or an output signal from a prior stage is input as an input signal to an output terminal outputting a signal depending on a first control pulse; a first source follower comprising: a gate connected to the output terminal of the first switch element; and a drain to which a second control pulse with a different phase to the first control pulse is supplied; wherein the first source follower outputs a signal to a first output line based on a signal input to the gate; a first capacitor component connected between the gate and the source of the first source follower; a first reference potential fixing circuit comprising; an input terminal to which the input signals are supplied; and an output terminal connected to a source of the first source follower; wherein the first reference potential fixing circuit fixes a potential of its own output terminal to the reference potential depending on a level of the input signal; a second switch element which connects an input terminal connected the source of the first source follower to an output terminal outputting a signal referring to the second control pulse; a second source follower comprising: a gate connected to the output terminal of the second switch element; a drain to which the first control pulse is supplied; and a source supplying an output signal to a subsequent stage and also outputting a signal to a second output line; a second capacitor component connected between the gate and the source of the second source follower; and a second reference potential fixing circuit comprising: an input terminal connected to the source of the first source follower; and an output terminal connected to the source of the second source follower, wherein the second reference potential fixing circuit fixes a potential of the output terminal to the reference potential depending on a level of the input signal from the source of the first source follower.

The second aspect of the present invention is the signal transmission circuit according to the first aspect, further comprising: a first sample hold circuit, comprising an input terminal to which the input signal is supplied and an output terminal connected to the input terminal of the first reference potential fixing circuit, for holding the input signal for a predetermined period; and a second sample hold circuit, comprising an input terminal connected to the source of the first source follower and an output terminal connected to the input terminal of the second reference potential fixing circuit, for holding the signal from the first source follower for a predetermined period.

The third aspect of the present invention is the signal transmission circuit according to the first aspect, further comprising: a first sample hold circuit, comprising an input terminal connected to the source of the first source follower and an output terminal connected to both the input terminal of the second reference potential fixing circuit and the input terminal of the second switch element, for holding the signal supplied from the source of the first source follower for a predetermined period; and a second sample hold circuit, comprising an input terminal connected to the source of the second source follower and an output terminal connected to both the input terminal of the first reference potential fixing circuit and the input terminal of the first switch element in a next stage, for holding the signal supplied from the source of the second source follower for a predetermined period.

The fourth aspect of the present invention is the signal transmission circuit according the first aspect, wherein the first reference potential fixing circuit comprises: a first transistor comprising: a gate as the input terminal; and a source fixed to a predetermined potential; a third switch element connected between a power supply line and a drain of the first transistor, wherein the third switch element is controlled by the first control pulse; and a second transistor comprising: a gate connected to the drain of the first transistor, and a source fixed to a predetermined potential, and a drain as the output terminal.

The fifth aspect of the present invention is the signal transmission circuit according to the first aspect, wherein the second reference potential fixing circuit comprises: a third transistor comprising: a gate as the input terminal; and a source fixed to a predetermined potential; a fourth switch element connected between a power supply line and a drain of the third transistor, wherein the fourth switch element is controlled by the second control pulse; and a fourth transistor comprising: a gate connected to the drain of the third transistor; a source fixed to a predetermined potential; and a drain as the output terminal.

The sixth aspect of the present invention is the signal transmission circuit according the first aspect, wherein the first reference potential fixing circuit comprises: a first transistor comprising; a gate as the input terminal; and a source fixed to a predetermined potential; a third switch element comprising; a source connected to the drain of the first transistor; a drain, wherein the first control pulse is supplied to; and a gate wherein the drain and the gate are connected; and a second transistor comprising; a gate connected to the drain of the first transistor; a source fixed to a predetermined potential; and a drain as the output terminal.

The seventh aspect of the present invention is the signal transmission circuit according to the first aspect, wherein the second reference potential fixing circuit comprises: a third transistor comprising; a gate as the input terminal; and a source fixed to a predetermined potential; a fourth switch element comprising; a source connected to the drain of the third transistor, and a drain, wherein the second control pulse is supplied; and a gate, wherein the drain and the gate are connected; and a fourth transistor comprising; a gate connected to the drain of the third transistor; a source fixed to a predetermined potential; and a drain as the output terminal.

The eighth aspect of the present invention is the signal transmission circuit according to the first aspect, further comprising: a first sample hold circuit, comprising an input terminal to which the input signal is supplied and an output terminal connected to the input terminal of the first reference potential fixing circuit, for holding the input signal for a predetermined period; and a second sample hold circuit, comprising an input terminal connected to the source of the first source follower and an output terminal connected to the input terminal of the second reference potential fixing circuit, for holding the signal for a predetermined period; wherein the first and the second reference potential fixing circuits comprising: a first transistor comprising; a gate as the input terminal of the reference potential fixing circuit; and a source fixed to a predetermined potential; a depression transistor comprising; a drain to which a power supply voltage is supplied; a gate; and a source, wherein the gate and the source are connected to a drain of the first transistor; and a second transistor comprising; a gate connected to the drain of the first transistor; and a source fixed to a predetermined potential; and a drain as the output terminal of the reference potential fixing circuit.

The ninth aspect of the present invention is the signal transmission circuit according to the first aspect, further comprising: a first sample hold circuit, comprising an input terminal to which the input signal is supplied and an output terminal connected to the input terminal of the first reference potential fixing circuit, for holding the input signal for a predetermined period; and a second sample hold circuit, comprising an input terminal connected to the source of the first source follower and an output terminal connected to the input terminal of the second reference potential fixing circuit, for holding the signal for a predetermined period; wherein, the first sample hold circuit is a transistor comprising; a gate which the first control pulse is supplied to; a drain; and a source, wherein one of the drain and the source is the input terminal of the first sample hold circuit while the other of the drain and the source is the output terminal of the first sample hold circuit; and the second sample hold circuit is a transistor comprising; a gate which the second control pulse is supplied to; a drain; and a source, wherein one of the drain and the source is the input terminal of the second sample hold circuit while the other of the drain and the source is the output terminal of the second sample hold circuit.

The tenth aspect of the present invention is the signal transmission circuit according to the first aspect, further comprising: a first sample hold circuit, comprising an input terminal to which the input signal is supplied and an output terminal connected to the input terminal of the first reference potential fixing circuit, for holding the input signal for a predetermined period; and a second sample hold circuit, comprising an input terminal connected to the source of the first source follower and an output terminal connected to the input terminal of the second reference potential fixing circuit, for holding the signal for a predetermined period; wherein, the first and the second sample hold circuits comprising: a transistor comprising; a drain as the input terminal of the sample hold circuit; a gate connected to the drain; and a source as the output terminal of the sample hold circuit; and a switch element, wherein a potential of the source of the transistor is controlled and fixed to the reference potential, referring to an input signal from the corresponding first and second sample hold circuits of a subsequent stage.

BRIEF DESCRIPTION THE DRAWINGS

DETAILED DESCRIPTION OF THE INVENTION

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

The signal transmission circuit according to the present invention will now be described in detail with reference made to FIGS. 1 through 10.

(First Embodiment)

Figure 1:
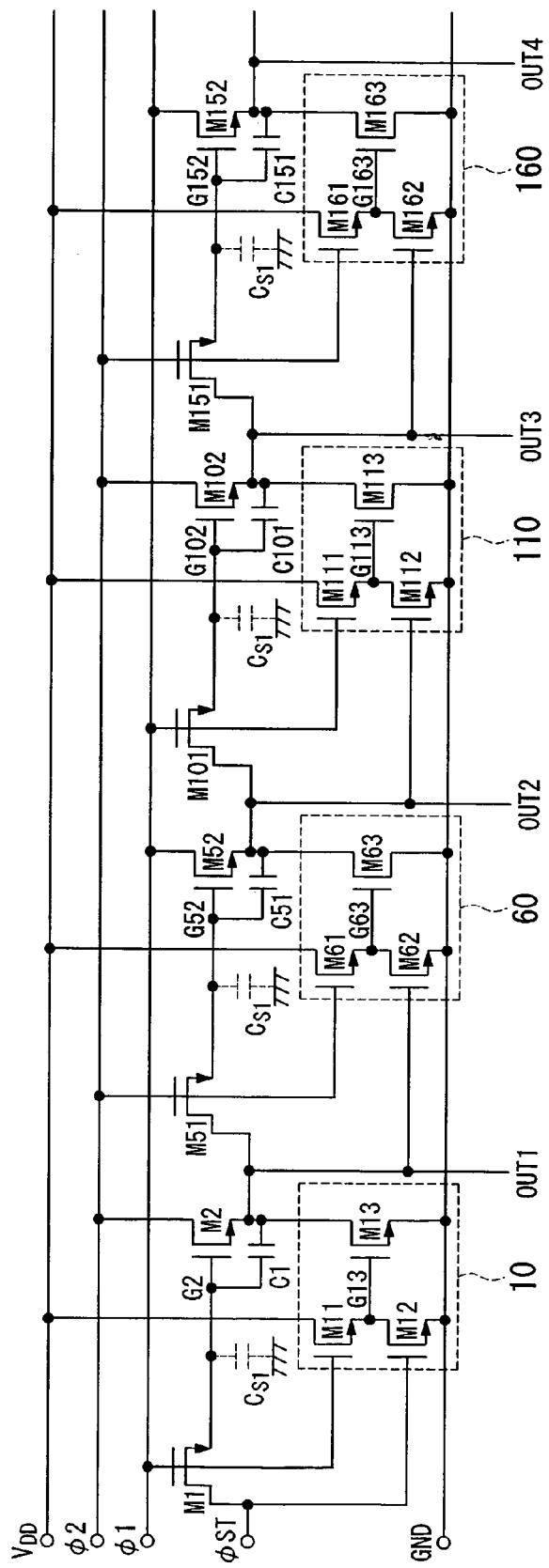
FIG. 1 is a view showing a circuit structure according to a first embodiment.

FIG. 1 is a circuit diagram showing a first embodiment of the signal transmission circuit of the present invention.

Figure 13:
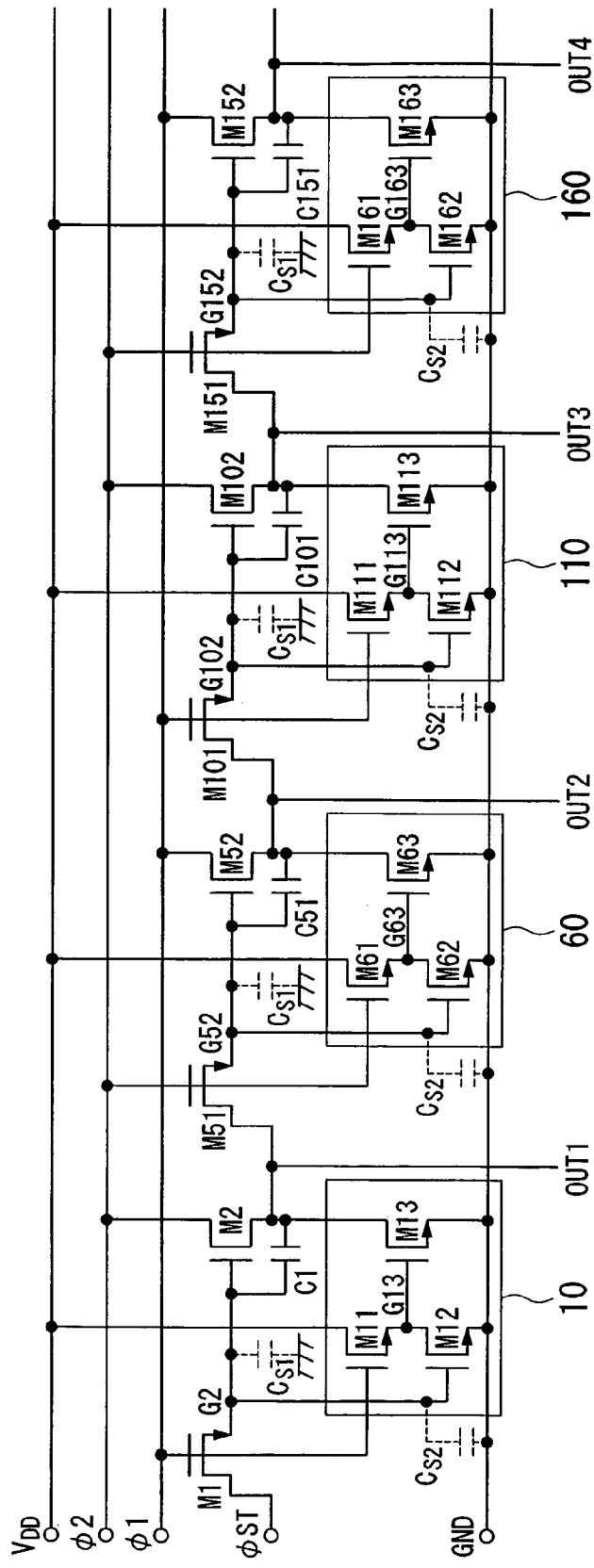
FIG. 13 is a view showing another conventional circuit structure.
Figure 14:
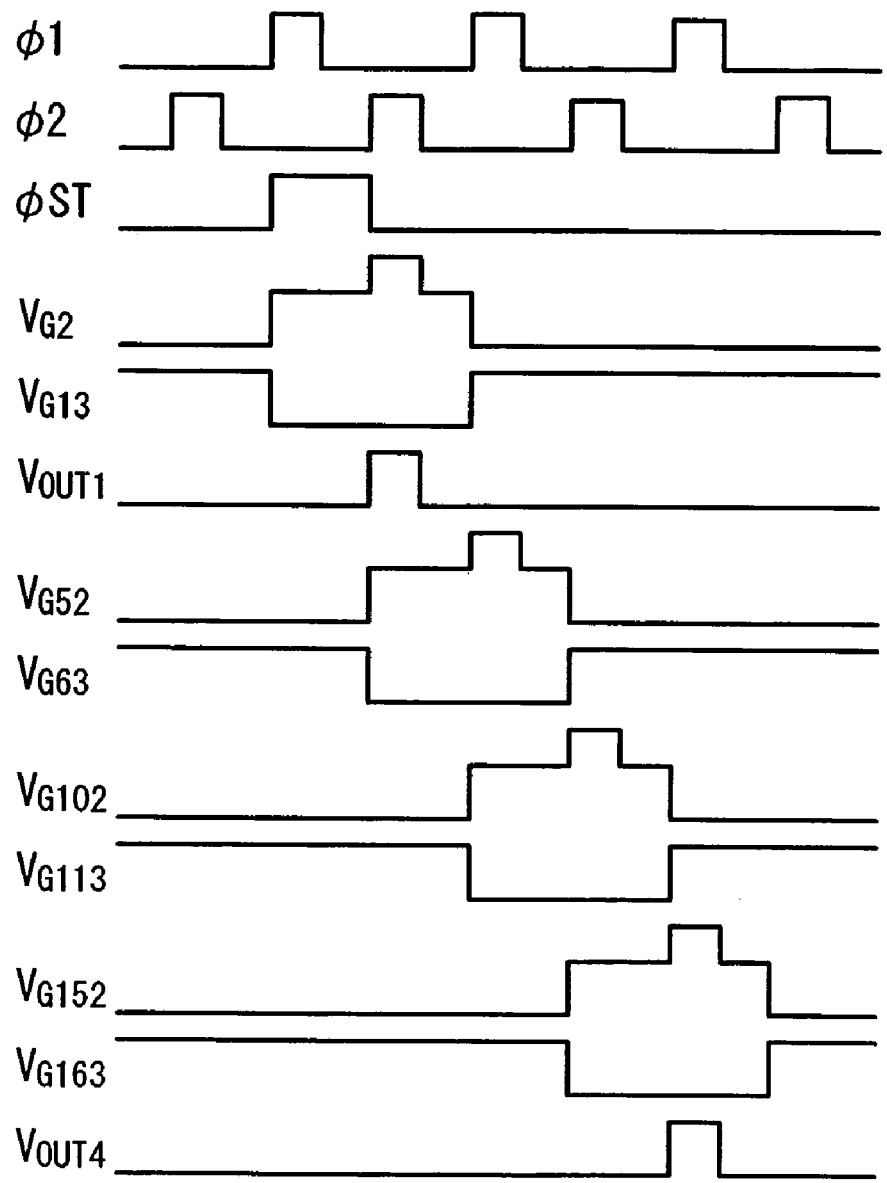
FIG. 14 is a view showing a timing chart of another conventional circuit.

Note that component elements that correspond to those in the conventional example shown in FIG. 13 are given the same symbols.

An input line $\phi_{ST}$ is connected to a gate of a MOS transistor M2 via a MOS transistor M1, and the input line $\phi_{ST}$ is connected to a gate of a MOS transistor M12. In addition, a bootstrap capacitor C1 is connected between the gate and source of the MOS transistor M2, and the source of the MOS transistor M2 is connected to a gate of a MOS transistor M52 via a MOS transistor M51 and to the ground line GND via a MOS transistor M13.

The source of the MOS transistor M2 is connected to the gate of a MOS transistor M62, and a bootstrap capacitor C51 is connected between the gate and source of the MOS transistor M52. The source of the MOS transistor M52 is connected to the ground line GND via a MOS transistor M63. Furthermore, the source of the MOS transistor M52 is connected to the next circuit.

A clock line $\phi_1$ is connected to the gate of the MOS transistors M1 and M11 and to the drain of the MOS transistor M52, and a clock line $\phi_2$ is connected to the gate of the MOS transistors M51 and M61 and to the drain of the MOS transistor M2. The power supply line $V_{DD}$ is connected to the drains of the MOS transistors M11 and M61.

The sources of the MOS transistors M11 and M61 are connected respectively to the gates of the transistors M13 and M63, and to the drains of the MOS transistors M12 and M62. The sources of the MOS transistors M12 and M62 are connected to the ground line GND. Thereafter, these transistor and bootstrap capacitor circuits are repeatedly connected in sequence. Note that OUT1, OUT2 . . . are output lines, G2, G52 . . . are gate lines of the transistors M2 and M52, G13 and G63 are gate lines of transistors M13 and M63 . . . , Cs$_1$ is a parasitic capacitor that does not contribute to the bootstrap effect that is applied to G2, G52 . . . , and 10, 60, 110, and 160 are output line fixed circuit.

Next, an operation of the signal transmission circuit shown in FIG. 1 will be described schematically using the timing chart shown in FIG. 2.

Figure 2:
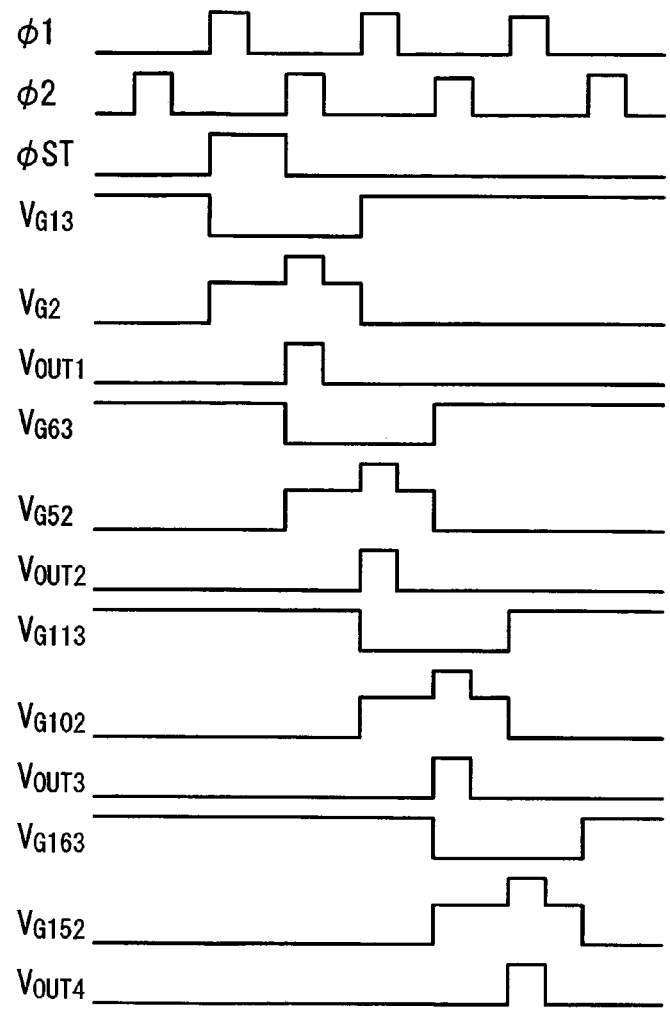
FIG. 2 is a view showing a timing chart of the circuit according to the first embodiment.

Note that, in the circuit shown in FIG. 1, the signals shown by $\phi_1$, $\phi_2$, and $\phi_{ST}$ in FIG. 2 are applied respectively to the clock lines $\phi_1$ and $\phi_2$ and to the input line $\phi_{ST}$ in the circuit shown in FIG. 1, and, in FIG. 1, VDD is a power supply potential and GND is a ground potential. In addition, high level potentials of the input signal $\phi_{ST}$ and the clock signals $\phi_1$ and $\phi_2$ are defined as $V_H$, and all threshold values of the MOS transistors are defined as $V_{th}$.

Firstly, when the clock signal $\phi_1$ and the input signal $\phi_{ST}$ change to a high level, the transistor M1 is placed in a conducting state. Consequently, a high level of the input signal $\phi_{ST}$ is sent to the transistor M1, and, as is shown in FIG. 2, the potential $V_{G2}$ of the gate line G2 of the transistor M2 changes to a high level. Here, if the high level potential of the gate line G2 of the transistor M2 is taken as $V_H'$, then Formula 10 below applies to $V_H'$.

$$V_H' = V_H - V_{th} \qquad \text{(Formula 10)}$$

When the potential $V_{G2}$ of the gate line G2 of the transistor M2 changes to a high level, the transistor M2 is in a conducting state, and a low level from the clock line $\phi_2$ is output to the potential $V_{OUT1}$ of the output line OUT1.

In contrast, in the output line fixed circuit shown by 10 in FIG. 1, when the input signal $\phi_{ST}$ changes to a high level, the transistor M12 is placed in a conducting state, and the potential of the gate line G13 of the transistor M13 changes to the ground potential, as is shown by $V_{G13}$ in FIG. 2. Accordingly, the transistor M13 changes to a cutoff state, and, because it is cut off from the output line OUT 1, there are no harmful effects on the output line OUT 1.

Next, when the clock signal $\phi_2$ changes to a high level, the potential $V_{G2}$ of the gate line G2 of the transistor M2 rises by the amount shown in Formula 11 via the bootstrap capacitor C1.

$C_{S1}$ is a parasitic capacitor that does not contribute to the bootstrap effect and that is caused by the gate of the transistor M2.

$$V_A = \{C_1/(C_1+C_{S1})\}V_H \qquad \text{(Formula 11)}$$

As a result, the potential $V_{G2}$ of the gate line G2 of the transistor M2 changes as is shown in Formula 12.

At this time, if the relationship shown in Formula 13 applies, the high level of the clock signal $\phi_2$ is extracted to the source of the transistor M2. Accordingly, the high level is extracted to the output line OUT1 as is shown by the $V_{OUT1}$ in FIG. 2. Simultaneously with this, because the transistor M51 changes to a conducting state in synchronization with the clock signal $\phi_2$, the potential of the gate line G52 of the transistor M52 changes to a high level, as is shown by the $V_{G52}$ in FIG. 2.

$$V_{G2} = V_H' + \{C_1/(C_1+C_{S1})\}V_H \qquad \text{(Formula 12)}$$

$$V_{G2} - V_{th} \geq V_H \qquad \text{(Formula 13)}$$

Moreover, at this time, because a high level of the output signal $V_{OUT1}$ of the previous stage is input into the output line fixing circuit shown by 60 in FIG. 1, the transistor M62 is placed in a conducting state, and the potential of the gate line G63 of the transistor M63 changes to the ground potential, as is shown by the $V_{G63}$ in FIG. 2. Accordingly, the transistor M63 changes to a cutoff state, and, because it is cut off from the output line OUT 2, there are no harmful effects on the output line OUT2.

Next, when the clock signal $\phi_1$ once again changes to a high level, the potential $V_{G52}$ of the gate line 52 of the transistor M52 is lifted to a higher potential than the high level potential $V_H$ of the clock signal $\phi_1$ via the bootstrap capacitor C51. As a result, the high level of the clock signal $\phi_1$ is extracted to the source of the transistor M52. Accordingly, the high level is extracted to the potential of the output line OUT2, as is shown by the $V_{OUT2}$ in FIG. 2.

At this time, in the output line fixing circuit shown by 10 in FIG. 1, because a low level of the input signal $\phi_{ST}$ is input, the transistor M12 is placed in a cutoff state. Moreover, because a high level of the clock signal $\phi_1$ is input into the transistor M11, it changes to a conducting state. Furthermore, because the transistor M11 is in a conducting state, the potential $V_{G13}$ of the gate line G13 of the transistor M13 changes to a high level. Accordingly, the transistor M13 changes to a conducting state, and the potential $V_{OUT1}$ of the output line OUT1 is fixed to the ground potential.

In the same way, the potentials of the gate line G102 of the transistor M102, of the gate line G113 of the transistor M113, of the output line OUT3, of the gate line 152 of the transistor M152, of the gate line G163 of the transistor M163, and of the output line OUT 4 that are shown in FIG. 1 change respectively in the manners shown by $V_{G102}$, $V_{G113}$, $V_{OUT3}$, $V_{G152}$, $V_{G163}$, and $V_{OUT4}$ shown in FIG. 2. Accordingly, in this circuit, transmission of high level signals of the input signal $\phi_{ST}$ is performed.

In this manner, according to the circuit shown in FIG. 1, because output lines that are not selected are fixed to the ground potential by the output line fixing circuits 10, 60 . . . , it is possible to suppress output noise that is synchronous with changes in the clock signal $\phi_1$ or $\phi_2$.

In addition, because control of the output line fixing circuits 10, 60 . . . is performed by an input signal or by the output signal, no excess parasitic capacitors are added to the gate lines G2, G52 . . . of the transistors M2, M52 . . . . Accordingly, there is no need to increase the bootstrap capacitors, and any increase in the surface area of the chip can be suppressed.

Figure 3:
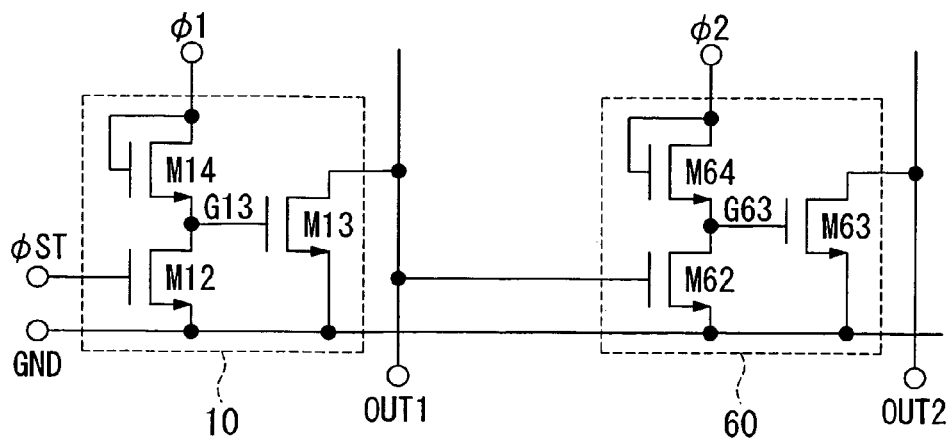
FIG. 3 is a view showing another circuit structure of an output line fixed section.

Next, FIG. 3 shows the output line fixed circuits 10, 60 . . . of FIG. 1 in a separate structural example.

Namely, the MOS transistors M11, M61 . . . of FIG. 1 are altered like the MOS transistors M14, M64 . . . of FIG. 3. In the MOS transistors M14, M64 . . . shown in FIG. 3, the gates and drains are altered so as to be connected to clock lines. The remainder of the structure is the same as that shown in FIG. 1 and the timing chart thereof is the same as that shown in FIG. 2.

A description will now be given using the circuit shown in FIG. 3 of the operation of the output line fixing circuit.

Firstly, when the input signal $\phi_{ST}$ and the clock signal $\phi_1$ change to a high level, in the output line fixing circuit 10, the transistors M12 and M14 are placed in a conducting state. As a result, the potential of the gate line G13 of the transistor M13 changes to the ground potential, as is shown by $V_{G13}$ in FIG. 2. As a result, because the transistor M13 is placed in a cutoff state, it is cut off from the output line OUT1.

Next, when the clock signal $\phi_2$ changes to a high level, the high level is extracted to the potential of the output line OUT 1, as is shown by the $V_{OUT1}$ in FIG. 2. At this time, because the high level of the $V_{OUT1}$ is input into the output line fixing circuit 60, the transistor M62 is placed in a conducting state. As a result, the potential of the gate line G63 of the transistor M63 changes to the ground potential, as is shown by $V_{G63}$ in FIG. 2. Consequently, because the transistor M63 is placed in a cutoff state, it is cut off from the output line OUT2.

Next, when the clock signal $\phi_1$ once again changes to a high level, because a low level of the input signal $\phi_{ST}$ is input into the output line fixing circuit 10, the transistor M12 changes to a cutoff state. In contrast, because the transistor M14 is placed in a conducting state, the potential $V_{G13}$ of the gate line G13 of the transistor M13 changes to a high level. As a result, the transistor M13 changes to a conducting state, and the potential $V_{OUT1}$ of the output line OUT1 is fixed to the ground potential. The same operation is subsequently repeated. In this manner, by constructing the output line fixed circuits 10, 60 . . . shown in FIG. 1 in the manner shown in FIG. 3, it is possible to fix the non-selected output line to the ground potential without using the power supply line $V_{DD}$.

(Second Embodiment)

Figure 4:
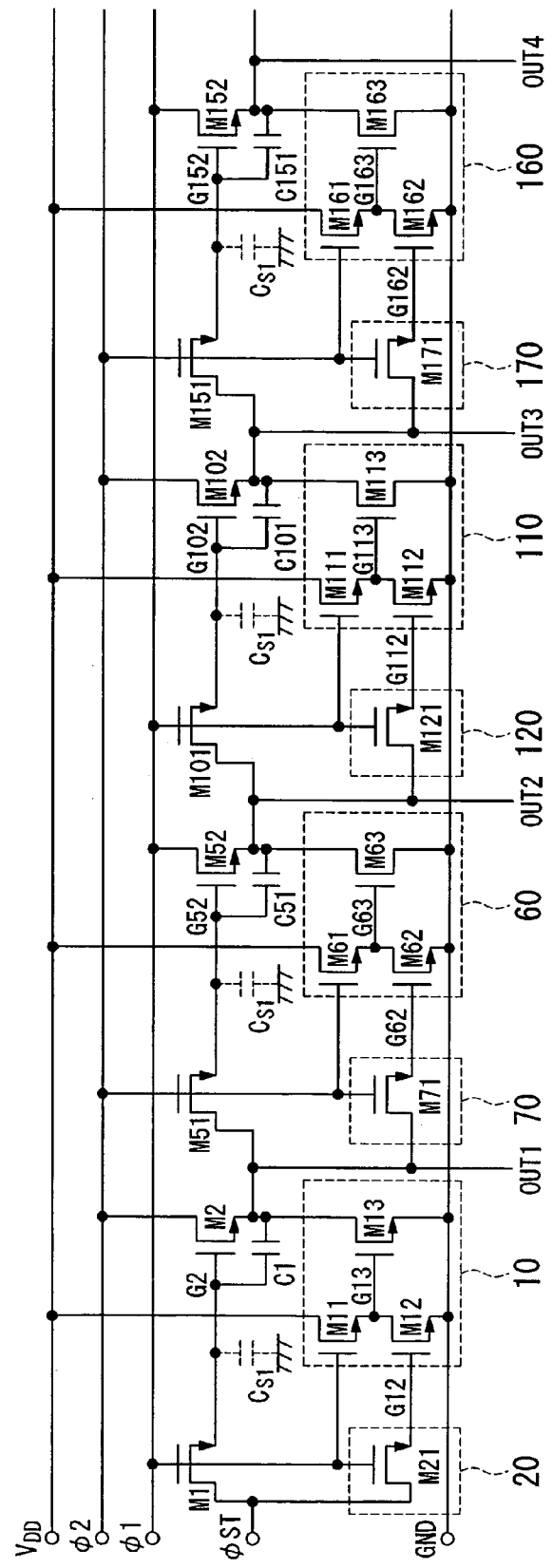
FIG. 4 is a view showing a circuit structure according to a second embodiment.

FIG. 4 is a circuit diagram showing the second embodiment relating to the signal transmission circuit of the present invention.

In contrast to the circuit shown in FIG. 1, this circuit is additionally provided with sample hold circuits (referred to below as SH circuits) 20, 70, 120, and 170 shown in FIG. 4. The SH circuits 20, 70 . . . are formed respectively by the MOS transistors M21, M71 . . . . The gates of the MOS transistors M21, M71 . . . are connected to the clock line $\phi_1$ or the clock line $\phi_2$, the drains thereof are connected to the input line $\phi_{ST}$ or to the previous output terminal, and the sources thereof are connected to gates of the transistors M12, M62 . . . that form the output line fixed circuits 10, 60 . . . . Note that component elements that correspond to those in the first embodiment have been given the same descriptive symbols.

Figure 5:
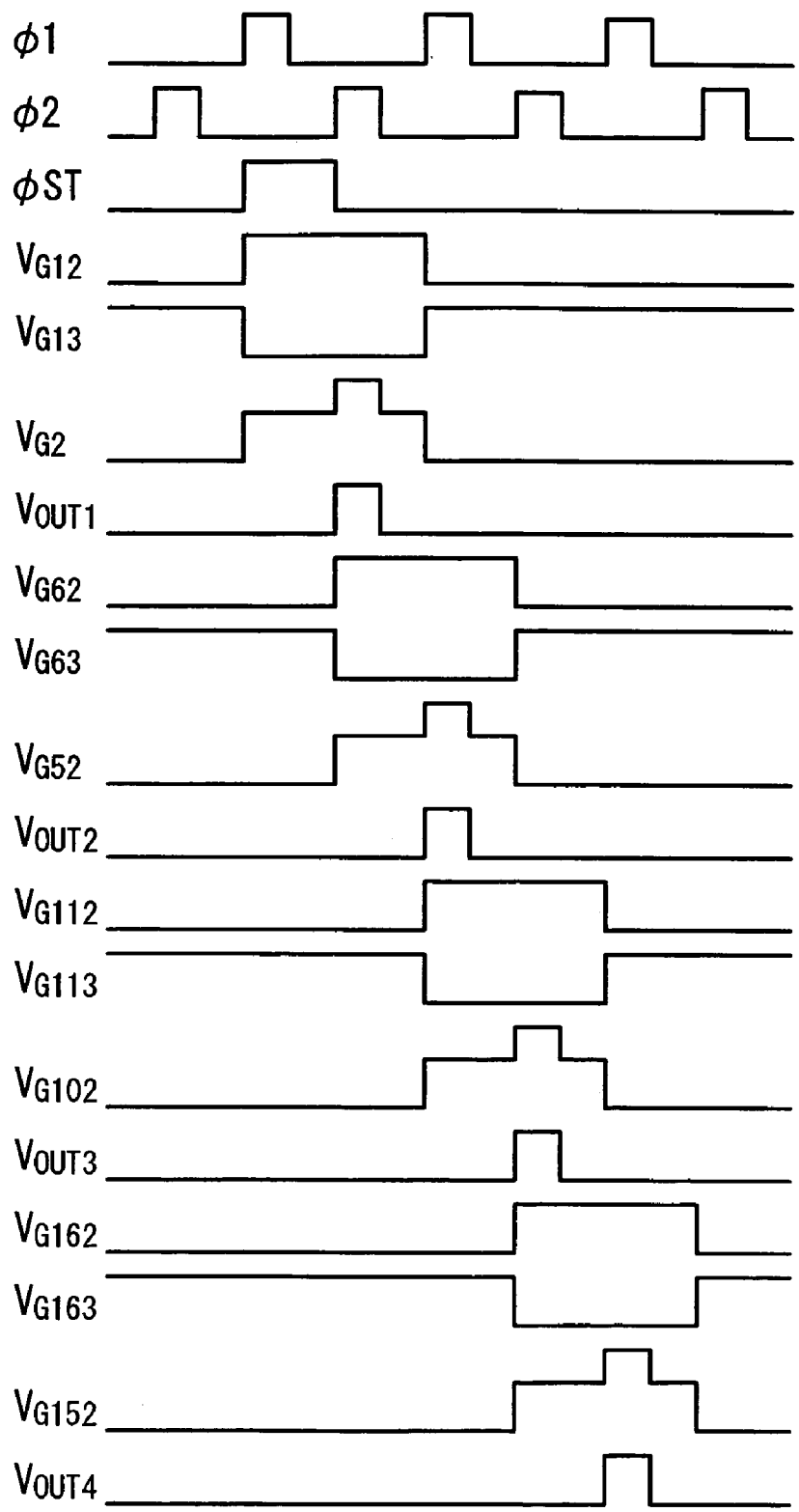
FIG. 5 is a view showing a timing chart of the circuit according to the second embodiment.

Next, an operation of the signal transmission circuit shown in FIG. 4 will be described schematically using the timing chart shown in FIG. 5.

Firstly, when the clock signal $\phi_1$ and the input signal $\phi_{ST}$ change to a high level, in the SH circuit 20, the transistor M21 is placed in a conducting state. Consequently, a high level of the input signal $\phi_{ST}$ is sent to the transistor M21, and the potential $V_{G12}$ of the gate line G12 of the transistor M12 changes to a high level. As a result, in the output line fixing circuit 10, the transistor M12 is placed in a conducting state, and the potential $V_{G13}$ of the gate line G13 of the transistor M13 is fixed to the ground potential.

In addition, the transistor M13 is placed in a cutoff state, and is cut off from the output line OUT1.

Here, even if the clock signal $\phi_1$ changes to a low level, the potential $V_{G12}$ of the gate line G12 of the transistor M12 holds its high level. Therefore, the transistor M13 reliably continues its cutoff state, and there are no harmful effects on the output line OUT1.

Next, when the clock signal $\phi_2$ changes to a high level, a high level of the clock signal $\phi_2$ is extracted to the potential $V_{OUT1}$ of the output line OUT1. Moreover, in the SH circuit 70, because the transistor M71 is placed in a conducting state, an output signal $V_{OUT1}$ is sent to the transistor M71, and the potential $V_{G62}$ of the gate line G62 of the transistor M62 changes to a high level. As a result, in the output line fixing circuit 60, the transistor M62 changes to a conducting state, and the potential $V_{G63}$ of the gate line G63 of the transistor M63 is fixed to the ground potential.

Accordingly, the transistor M63 is placed in a cutoff state, and is cut off from the output line OUT2. Here, in the same way, even if the clock signal $\phi_2$ changes to a low level, because the potential $V_{G62}$ of the gate line G62 of the transistor M62 maintains a high level, the transistor M63 reliably continues its cutoff state, and there are no harmful effects on the output line OUT2.

Next, when the clock signal $\phi_1$ once again changes to a high level, a high level of the clock signal $\phi_1$ is extracted to the potential $V_{OUT2}$ of the output line OUT2. Moreover, in the SH circuit 20, because the transistor M21 is placed in a conducting state and a low level of the input signal $\phi_{ST}$ is input, the potential $V_{G12}$ of the gate line G12 of the transistor M12 changes to a low level.

As a result, in the output line fixed circuit 10, because the transistor M12 changes to a cutoff state, the transistor M11 changes to a conducting state, and the power supply voltage $V_{DD}$ is sent to the gate line G13 of the transistor M13, the potential $V_{G13}$ of the gate line G13 of the transistor M13 changes to a high level. Accordingly, the transistor M13 is placed in a conducting state, and the potential $V_{OUT1}$ of the output line OUT1 is fixed to the ground potential. Thereafter, the same operation is repeated.

Accordingly, in the case of the structure shown in FIG. 4 as well, in the same way as in the first embodiment, because a non-selected output line is fixed to a reference potential, output noise can be controlled. In addition, no excess parasitic capacitors are added to the gate lines G2, G52 . . . of the transistors M2, M52 . . . , and any increase in the surface area of the chip can be suppressed.

Furthermore, according to the structure shown in FIG. 4, because the output line fixing circuit is controlled via the SH circuit, even after the previous output has been reversed, because the gate line G13 of the transistor M13 of the output line fixing circuit is fixed to the ground potential when selected, it is possible to reliably operate the output line fixing circuit.

Figure 6:
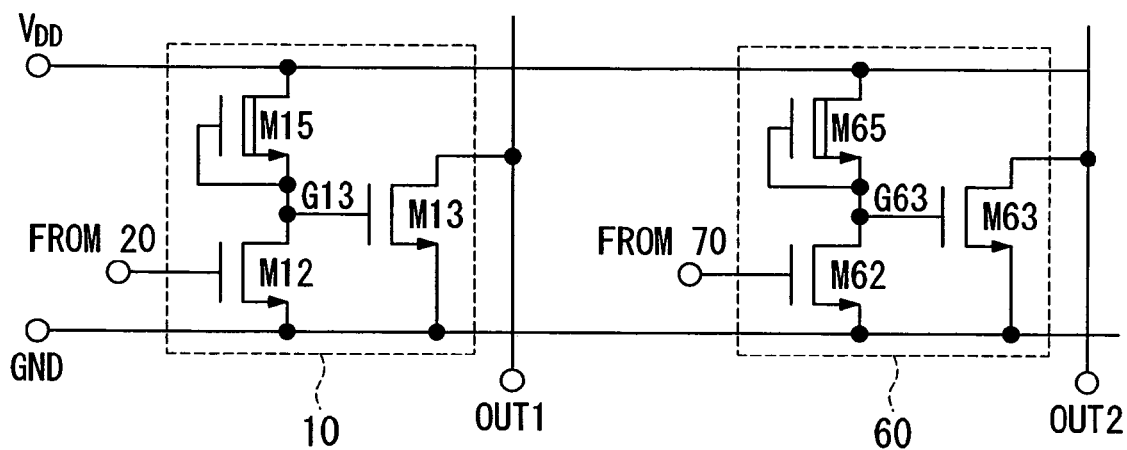
FIG. 6 is a view showing another circuit structure of an output line fixed section.

Next, FIG. 6 shows another structural example of the output line fixing circuits 10, 60 . . . that are shown in FIG. 4.

Namely, the MOS transistors M11, M61 . . . of FIG. 4 are altered like the depletion MOS transistors M15, M65 . . . of FIG. 6. In the depletion MOS transistors M15, M65 . . . of FIG. 6, the gates and sources are altered so as to be connected to the gates of the MOS transistors M13, M63 . . . . The remainder of the structure is the same as that shown in FIG. 4, and the timing chart thereof is the same as that shown in FIG. 5. Here, by connecting the gates and sources, the depression MOS transistors M15, M65 . . . operate as constant current sources whose current value is fixed depending on the configuration. Hereinafter, only the operation of this output line fixing circuit is described.

Firstly, when the clock signal $\phi_1$ and the input signal $\phi_{ST}$ change to a high level, the output portion of the SH circuit 20 changes to a high level. Accordingly, in the output line fixed circuit 10, the transistor M12 is placed in a conducting state. As a result of this, the current capability of the transistor M12 is made larger than the current capability of the transistor M15. Consequently, because the potential $V_{G13}$ of the gate line G13 of the transistor M13 is fixed to the ground potential, it is cut off from the output line OUT1. Here, even if the clock signal $\phi_1$ changes to a low level, the potential of the gate line G12 of the transistor M12 holds its high level. Therefore, the transistor M13 reliably continues its cutoff state, and there are no harmful effects on the output line OUT1.

Next, when the clock signal $\phi_2$ changes to a high level, the output portion of the SH circuit 70 changes to a high level. Accordingly, in the output line fixed circuit 60, because the transistor M62 changes to a conducting state, and the potential $V_{G63}$ of the gate line G63 of the transistor M63 is fixed to the ground potential, it is cut off from the output line OUT2. Here, even if the clock signal $\phi_2$ changes to a low level, the potential $V_{G62}$ of the gate line G62 of the transistor M62 holds its high level. Therefore, the transistor M63 reliably continues its cutoff state, and there are no harmful effects on the output line OUT2.

Next, when the clock signal $\phi_1$ once again changes to a high level, the output portion of the SH circuit 20 changes to a low level. Accordingly, in the output line fixed circuit 10, because the transistor M12 changes to a cutoff state, and because the transistor M15 is supplying current, the potential $V_{G13}$ of the gate line 13 of the transistor M13 rises to the power supply potential $V_{DD}$. As a result, the transistor M13 is placed in a conducting state, and the potential $V_{OUT1}$ of the output line OUT1 is fixed to the ground potential. Thereafter, the same operation is repeated.

In this manner, in FIG. 4, even if the output line fixing circuits 10, 60 . . . are constructed in the manner shown in FIG. 6, the output line can be fixed to the ground potential when not selected. In addition, according to the structure shown in FIG. 6, when the transistor M12 is in a cutoff state, it is possible to lift the potential $V_{G13}$ of the gate line G13 of the transistor M13 to the power supply potential $V_{DD}$, and it is possible to lower the ON resistance of the transistor M13. Moreover, in FIG. 4, by constructing the output line fixing circuits 10, 60 . . . in the manner shown in FIG. 3, the output line that is not selected can be fixed to the ground potential without using the power supply line $V_{DD}$.

Figure 7:
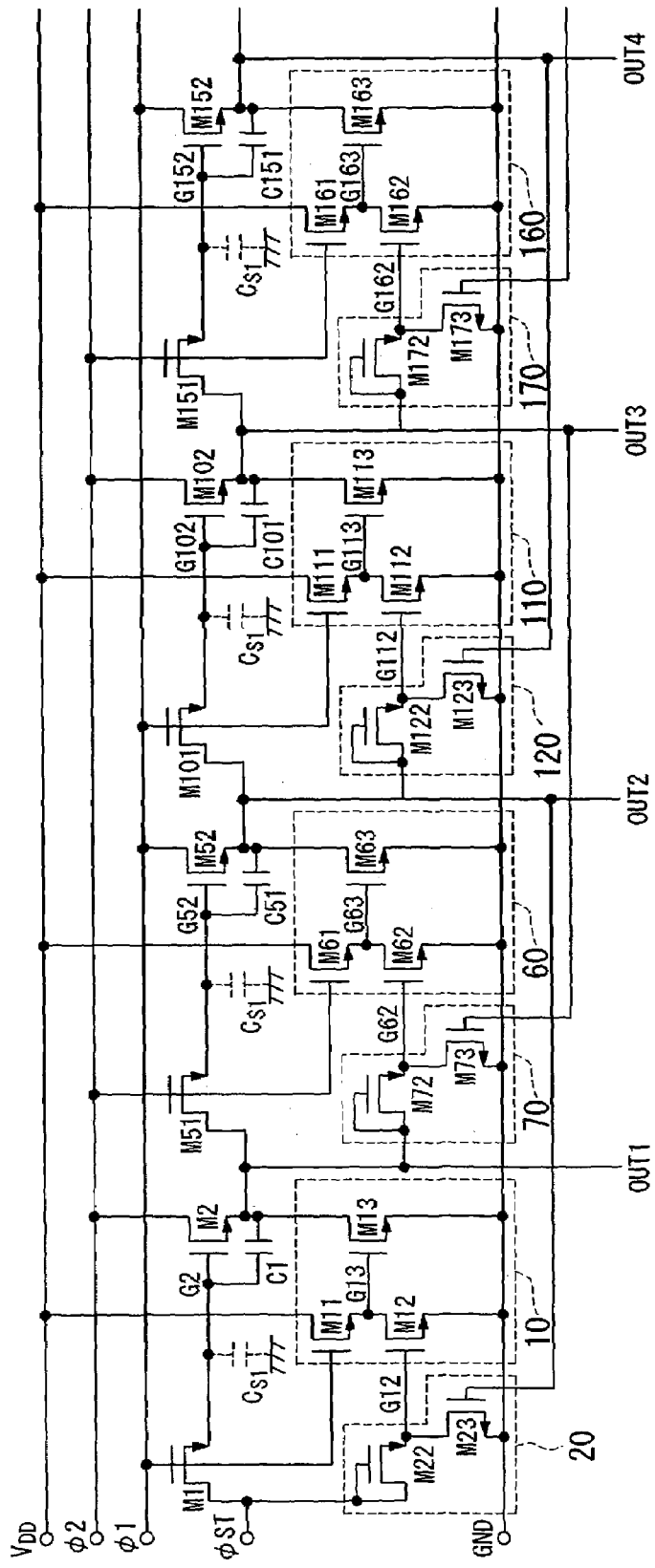
FIG. 7 is a view showing a circuit structure according to a variant example of the second embodiment.

Next, FIG. 7 shows a variation of the structure of the SH circuits 20, 70 . . . shown in FIG. 4.

The SH circuits 20, 70 . . . are formed by the MOS transistors M22, M72 . . . and the MOS transistors M23, M73 . . . . The gates and drains of the MOS transistors M22, M72 . . . are connected to an input terminal or to the previous output terminal, while the sources thereof are connected to the gates of the transistors M12, M62 . . . that make up the output line fixing circuits 10, 60 . . . , and to the drains of the transistors M23, M73 . . . . Moreover, the sources of the transistors M23 and M73 are connected to ground lines, and the gates are connected to the next output terminal. The remainder of the structure is the same as that shown in FIG. 4 and the timing chart thereof is the same as that shown in FIG. 5.

A description will now be given of the operation of this structure that is different from that of the structure shown in FIG. 4.

Firstly, when the clock signal $\phi_1$ and the input signal $\phi_{ST}$ change to a high level, in the SH circuit 20, the transistor M22 is placed in a conducting state and the transistor M23 is placed in a cutoff state. Because of this, a high level of the input signal $\phi_{ST}$ is sent to the transistor M22, and the potential $V_{G12}$ of the gate line G12 of the transistor M12 changes to a high level. As a result of this, the output line fixing circuit 10 is cutoff from the output line OUT1. Here, even if the clock signal $\phi_1$ changes to a low level, the potential $V_{G12}$ of the gate line G12 of the transistor M12 holds its high level. Therefore, the transistor M13 reliably continues its cutoff state, and there are no harmful effects on the output line OUT1.

Next, when the clock signal $\phi_2$ changes to a high level, the high level of the clock signal $\phi_2$ is extracted to the output line OUT1 and, in the SH circuit 70, the transistor M72 changes to a conducting state and the transistor M73 changes to a cutoff state. Because of this, the potential $V_{OUT1}$ of the previous output line OUT1 is sent to the transistor M72, and the potential $V_{G62}$ of the gate line G62 of the transistor M62 changes to a high level. As a result of this, the output line fixing circuit 60 is cutoff from the output line OUT2. Here, even if the clock signal $\phi_2$ changes to a low level, the potential $V_{G62}$ of the gate line G62 of the transistor M62 holds its high level. Therefore, the transistor M63 reliably continues its cutoff state, and there are no harmful effects on the output line OUT2.

Next, when the clock signal $\phi_1$ once again changes to a high level, the high level of the clock signal $\phi_1$ is extracted to the potential $V_{OUT2}$ of the output line OUT2 and, at the same time, is input into the gate of the transistor M23 of the SH circuit 20. Because of this, in the SH circuit 20, the transistor M23 is placed in a conducting state and the potential $V_{G12}$ of the gate line G12 of the transistor M12 changes to a low level. Accordingly, the potential $V_{OUT1}$ of the output line OUT1 is fixed to the ground potential via the output line fixing circuit 10.

In this manner, even when the structures of the SH circuits 20, 70 . . . that are shown in FIG. 4 are formed in the manner shown in FIG. 7, it is possible to control the output line fixed circuits 10, 60 . . . using the SH circuits 20, 70. . . . In addition, according to the structure shown in FIG. 7, because the SH circuits 20, 70 . . . are not connected to the clock lines, an increase in the operation speed, and a reduction in the drive capability of an external circuit supplying the clock signal to the signal transmission circuit can be obtained. Moreover, it is also possible in the structure shown in FIG. 7 to form the output line fixing circuits 10, 60 . . . in the manners shown in FIG. 3 and FIG. 6.

(Third Embodiment)

Figure 8:
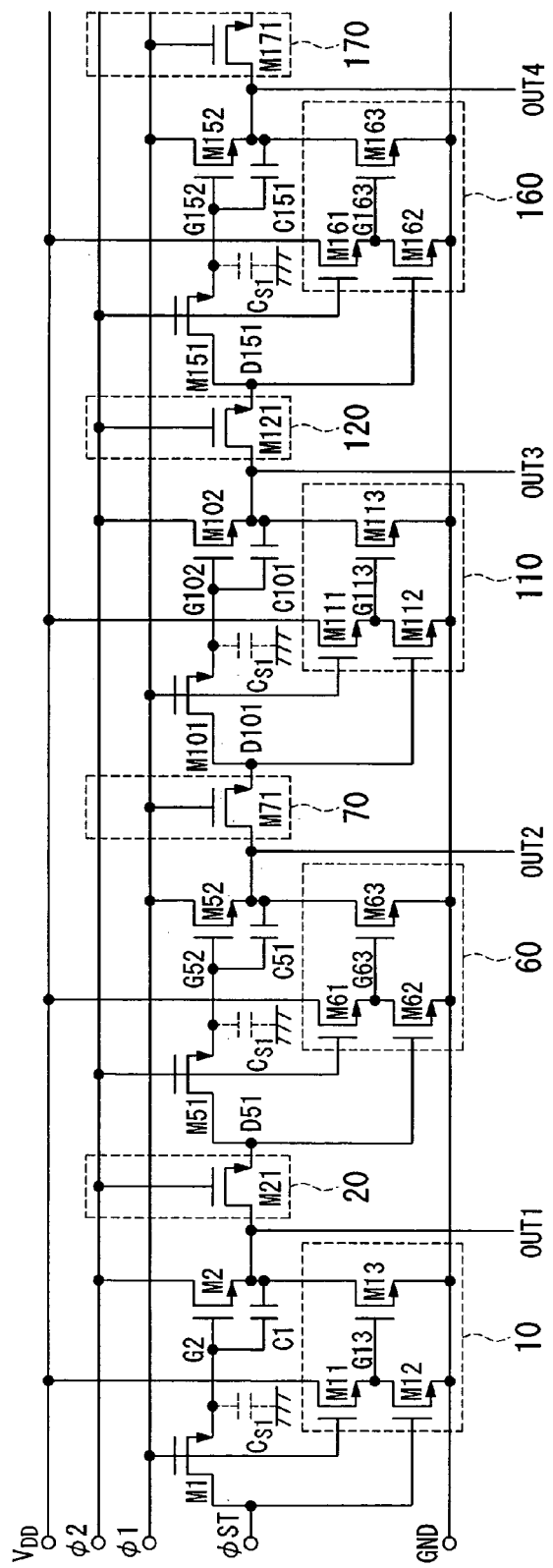
FIG. 8 is a view showing a circuit structure according to a third embodiment.

FIG. 8 is a circuit diagram showing the third embodiment relating to the signal transmission circuit of the present invention.

In contrast to the first embodiment shown in FIG. 1, this circuit is altered so as to be connected to the next stage via the SH circuits 20, 70 . . . . The remainder of the structure is the same. Note that component elements that correspond to those in the first embodiment have been given the same descriptive symbols. Only operations that are different from those of the first embodiment are described below.

Figure 9:
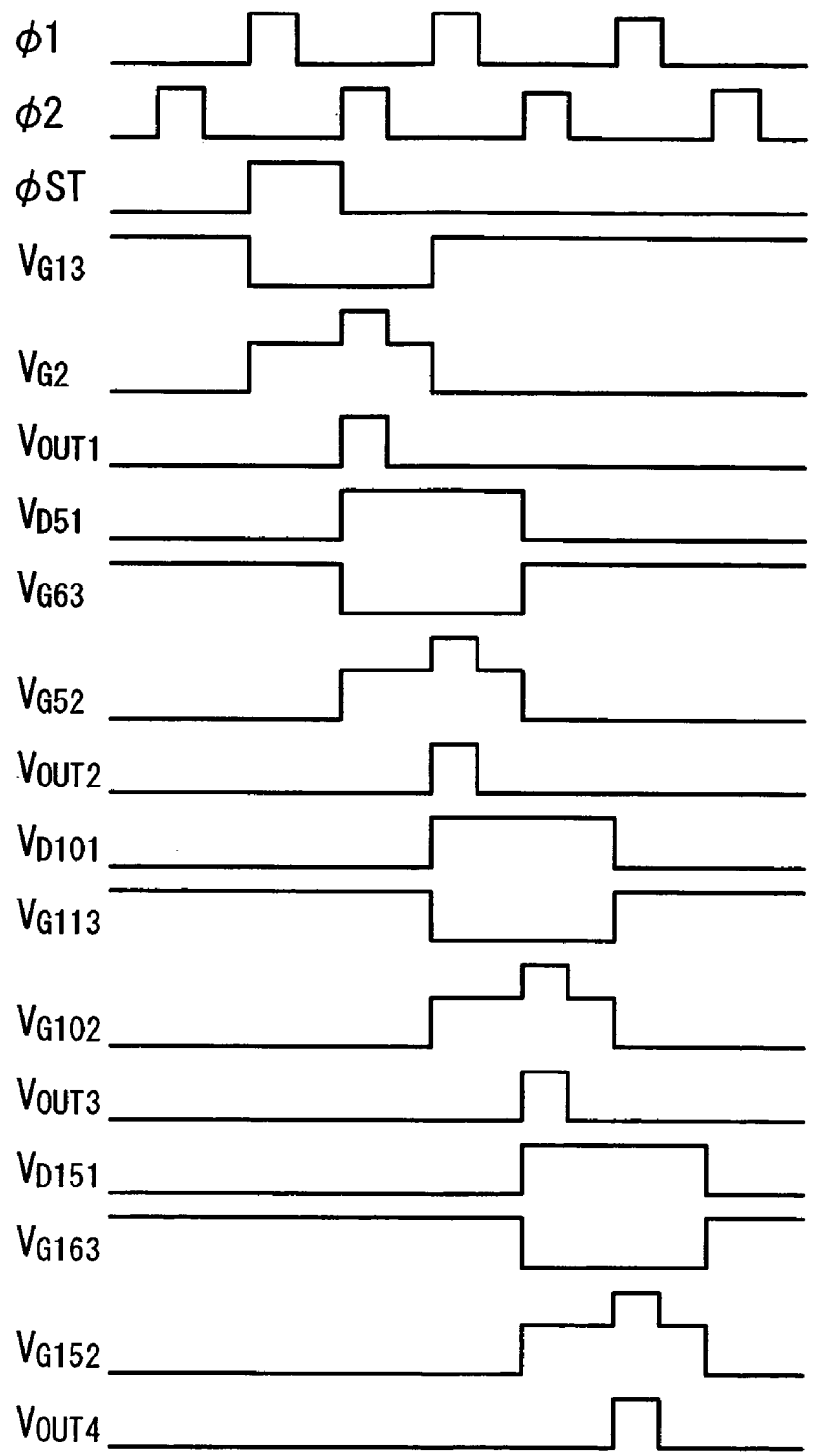
FIG. 9 is a view showing a timing chart of the circuit according to the third embodiment.

An operation of the signal transmission circuit shown in FIG. 8 will be described schematically using the timing chart shown in FIG. 9.

Firstly, when the input signal $\phi_{ST}$ and the clock signal $\phi_1$ change to a high level, the output line fixing circuit 10 is cutoff from the output line OUT1. Next, when the clock signal $\phi_2$ changes to a high level, the high level of the clock signal $\phi_2$ is extracted to the potential $V_{OUT1}$ of the output line OUT1.

In addition, because the transistor M21 of the SH circuit 20 is in a conducting state, the potential $V_{D51}$ of the drain D51 of the transistor M51 changes to a high level. Accordingly, the output line fixing circuit 60 is cutoff from the output line OUT2. Here, even if the clock signal $\phi_2$ changes to a low level, the potential $V_{D51}$ of the drain D51 of the transistor M51 holds its high level. Therefore, the transistor M63 reliably continues its cutoff state, and there are no harmful effects on the output line OUT2.

Next, when the clock signal $\phi_1$ once again changes to a high level, the high level of the clock signal $\phi_1$ is extracted to the potential $V_{OUT2}$ of the output line OUT2, and a potential $V_{D101}$ of the drain D101 of the transistor M101 changes to a high level. Moreover, the potential $V_{OUT1}$ of the output line OUT1 is fixed to the ground potential by the output line fixed circuit 10.

Next, when the clock signal $\phi_2$ once again changes to a high level, in the SH circuit 20, because the transistor M21 changes to a conducting state and a low level of the previous output $V_{OUT1}$ is input, the potential $V_{D51}$ of the drain D51 of the transistor M51 changes to a low level. Accordingly, the potential $V_{OUT2}$ of the output line OUT2 is fixed to the ground potential by the output line fixing circuit 60. The same operation is subsequently repeated.

Accordingly, as is shown in FIG. 8, even if a connection is made with a subsequent stage via the SH circuits 20, 70 . . . , in the same way as in the first embodiment, because a non-selected output line is fixed to a reference potential, output noise can be controlled. In addition, no excess parasitic capacitors are added to the gate lines G2, G52 . . . of the transistors M2, M52 . . . , and any increase in the surface area of the chip can be suppressed. Furthermore, according to the structure shown in FIG. 8, because the output line fixing circuit is controlled via the SH circuit, even after the previous output has been reversed, because the gate line G63 of the transistor M63 of the output line fixing circuit is fixed to the ground potential when selected, it is possible to reliably operate the output line fixing circuit.

Figure 10:
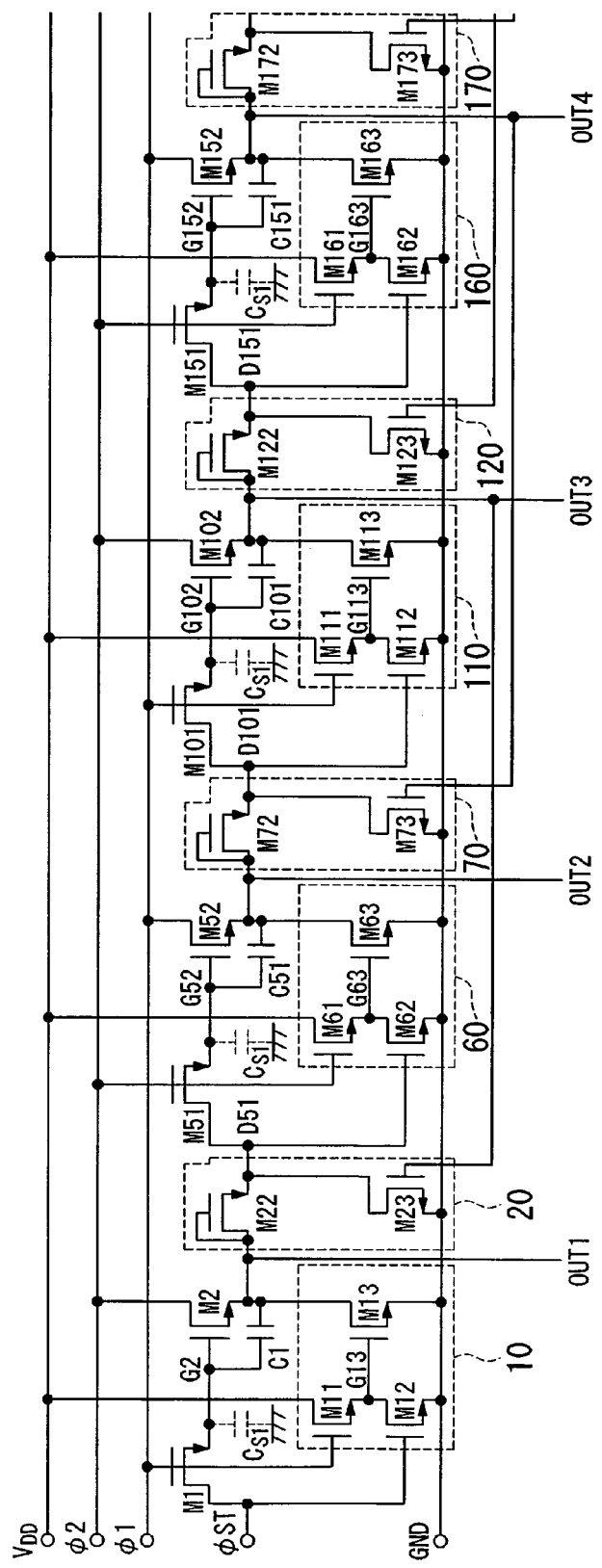
FIG. 10 is a view showing a circuit structure according to a variant example of the third embodiment.
Figure 11:
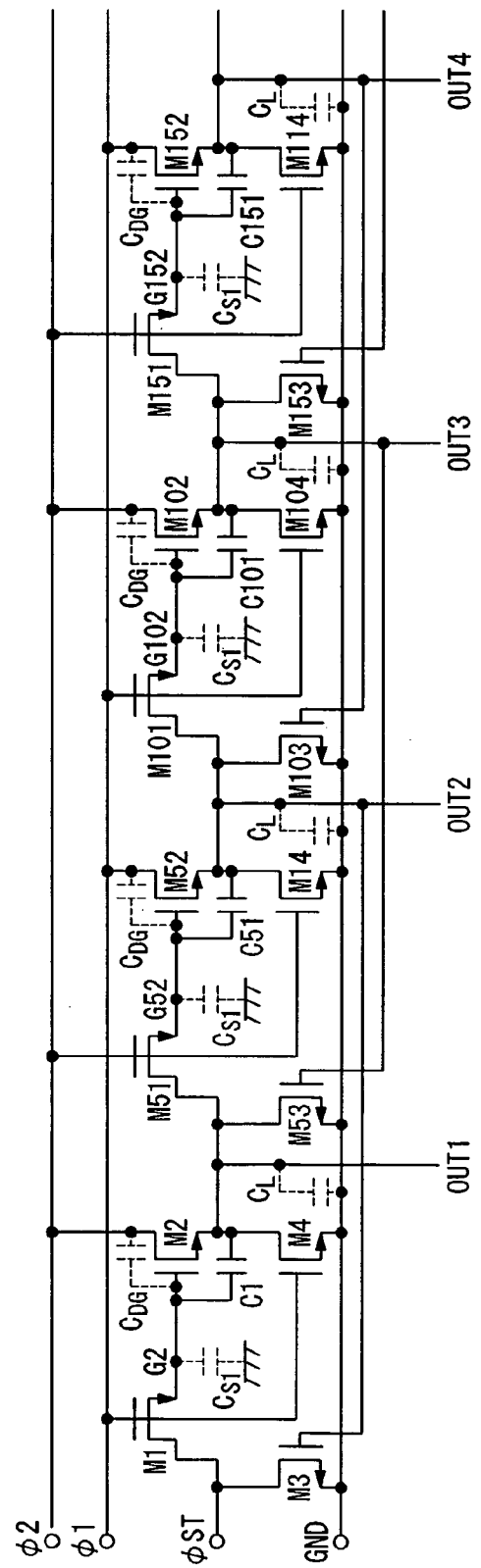
FIG. 11 is a view showing a conventional circuit structure.
Figure 12:
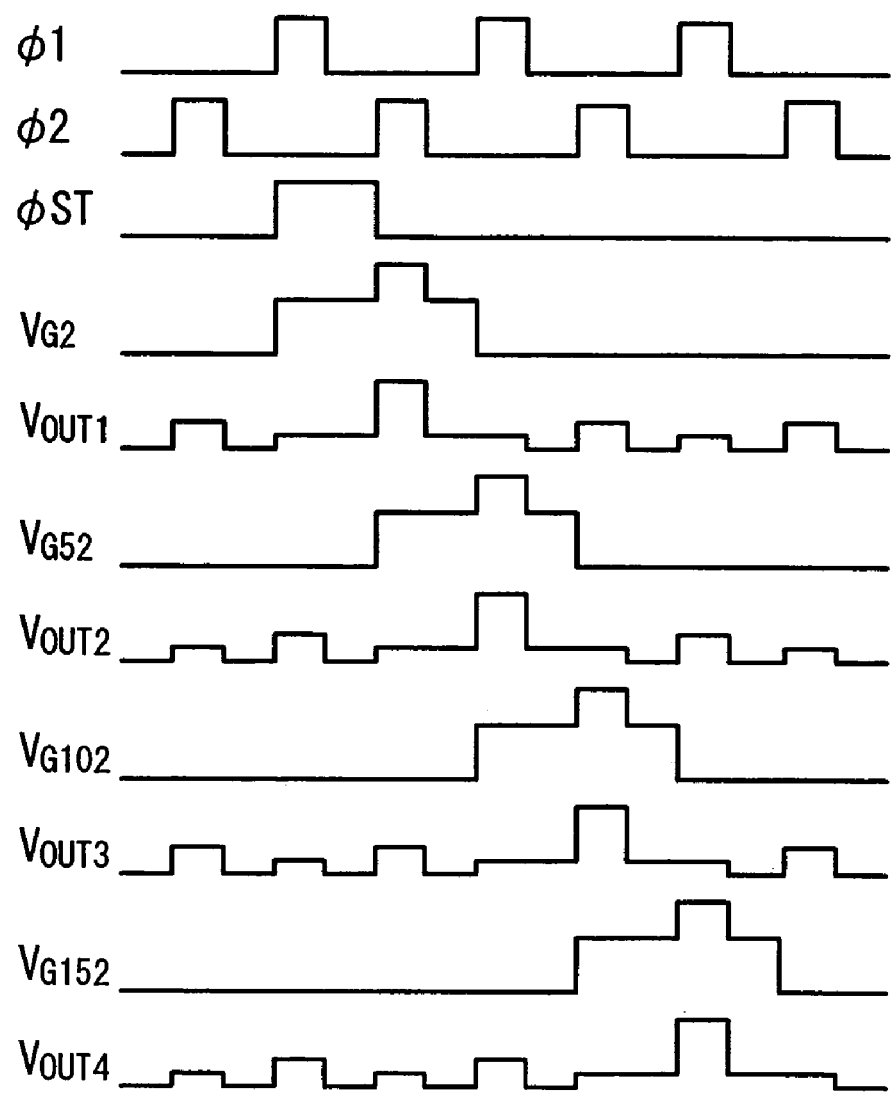
FIG. 12 is a view showing a timing chart of a conventional circuit.

Next, FIG. 10 shows a variation of the structure of the SH circuits 20, 70 . . . shown in FIG. 8, while the remainder of the structure is the same as that shown in FIG. 8. The timing chart thereof is the same as that shown in FIG. 9. Even when the SH circuits 20, 70 . . . are constructed in the manner shown in FIG. 10, the output line fixing circuits can be controlled using the SH circuits 20, 70 . . . . In addition, because the SH circuits 20, 70 . . . are not connected to the clock lines, an increase in the operation speed, and a reduction in the drive capability of an external circuit supplying the clock signal to the signal transmission circuit can be obtained.

Moreover, in FIG. 8 and FIG. 10, by constructing the output line fixing circuits 10, 60 . . . in the manner shown in FIG. 3, the output line when not selected can be fixed to the ground potential without using the power supply line $V_{DD}$. Furthermore, in FIG. 8 and FIG. 10, even if the output line fixing circuits 10, 60 . . . are constructed in the manner shown in FIG. 6, the output line can be fixed to the ground potential when not selected. In addition, when the transistor M12 is in a cutoff state, it is possible to lift the potential $V_{G13}$ of the gate line G13 of the transistor M13 to the power supply potential $V_{DD}$, and it is possible to lower the ON resistance of the transistor M13.

Embodiments of the present invention have been described in detail above with reference made to the drawings, however, the specific structure thereof is not limited to these embodiments, and various design modifications and the like may be made insofar as they do not depart from the scope of the present invention.

According to the present invention, because the output line that is not selected is fixed to a reference potential, the effect is obtained that it is possible to control output noise. In addition, there is no need to increase the bootstrap capacity, and any increase in the surface area of the chip can be controlled.

In addition, by providing a sample hold circuit, an output line can be reliably fixed to the reference potential even after an output signal from the previous stage has been reversed.

Moreover, according to the present invention, it is possible to form a reference potential fixing circuit simply, and an output line that is not selected can be fixed to the reference potential. In addition, in the reference potential fixing circuit, the ON resistance can be reduced when the output line is fixed to the reference potential.

In addition, according to the present invention, the sample hold circuit can be formed simply by one transistor, so that an output line can be reliably fixed to the reference potential even after an output signal from the previous stage has been reversed.

Furthermore, according to the present invention, the sample hold circuit can be formed by two transistors, so that an output line can be reliably fixed to the reference potential even after an output signal from the previous stage has been reversed. In addition, because no control pulse is supplied to the sample hold circuit, it is possible to reduce the load on the line that is used to supply the control pulse. As a result, an improvement in the operating speed and a reduction in the drive capability of an external circuit supplying the clock signal to the signal transmission circuit become possible.

What is claimed is:

1. A signal transmission circuit comprising:
a first switch element connecting an input terminal which a start signal or an output signal from a prior stage is input as a first input signal to an output terminal outputting a signal depending on a first control pulse;
a first source follower comprising:
a gate connected to the output terminal of the first switch element; and
a drain to which a second control pulse with a different phase to the first control pulse is supplied; wherein
the first source follower outputs a signal to a first output line based on an output signal of the first switch input to the gate;
a first capacitor component connected between the gate and the source of the first source follower;
a first reference potential fixing circuit comprising;
an input terminal to which the first input signal is supplied; and
an output terminal connected to a source of the first source follower; wherein
the first reference potential fixing circuit fixes a potential of its own output terminal to a reference potential depending on a level of the first input signal;
a second switch element which connects an input terminal connected to the source of the first source follower to an output terminal outputting a signal in response to the second control pulse;
a second source follower comprising:
a gate connected to the output terminal of the second switch element;
a drain to which the first control pulse is supplied; and
a source supplying an output signal to a subsequent stage and also outputting a signal to a second output line;
a second capacitor component connected between the gate and the source of the second source follower; and
a second reference potential fixing circuit comprising:
an input terminal connected to the source of the first source follower; and
an output terminal connected to the source of the second source follower, wherein
the second reference potential fixing circuit fixes a potential of the output terminal to a reference potential depending on a level of the input signal from the source of the first source follower.

2. The signal transmission circuit according to claim 1, further comprising:
a first sample hold circuit, comprising an input terminal to which the first input signal is supplied and an output terminal connected to the input terminal of the first reference potential fixing circuit, for holding the input signal for a predetermined period; and
a second sample hold circuit, comprising an input terminal connected to the source of the first source follower and an output terminal connected to the input terminal of the second reference potential fixing circuit, for holding the signal from the first source follower for a predetermined period.

3. The signal transmission circuit according to claim 1, further comprising:
a first sample hold circuit, comprising an input terminal connected to the source of the first source follower and an output terminal connected to both the input terminal of the second reference potential fixing circuit and the input terminal of the second switch element, for holding the signal supplied from the source of the first source follower for a predetermined period; and a second sample hold circuit, comprising an input terminal connected to the source of the second source follower and an output terminal connected to both the input terminal of the first reference potential fixing circuit and the input terminal of the first switch element in a next stage, for holding the signal supplied from the source of the second source follower for a predetermined period.

4. The signal transmission circuit according claim 1, wherein
the first reference potential fixing circuit comprises:
a first transistor comprising:
a gate as the input terminal; and
a source fixed to a predetermined potential;
a third switch element connected between a power supply line and a drain of the first transistor, wherein the third switch element is controlled by the first control pulse; and
a second transistor comprising:
a gate connected to the drain of the first transistor, and
a source fixed to a predetermined potential, and a drain as the output terminal.

5. The signal transmission circuit according claim 1, wherein
the second reference potential fixing circuit comprises:
a third transistor comprising:
a gate as the input terminal; and
a source fixed to a predetermined potential;
a fourth switch element connected between a power supply line and a drain of the third transistor, wherein the fourth switch element is controlled by the second control pulse; and
a fourth transistor comprising:
a gate connected to the drain of the third transistor; a source fixed to a predetermined potential; and
a drain as the output terminal.

6. The signal transmission circuit according claim 1, wherein
the first reference potential fixing circuit comprises:
a first transistor comprising;
a gate as the input terminal; and
a source fixed to a predetermined potential;
a third switch element comprising;
a source connected to the drain of the first transistor;
a drain, wherein the first control pulse is supplied to; and
a gate wherein the drain and the gate are connected; and
a second transistor comprising;
a gate connected to the drain of the first transistor;
a source fixed to a predetermined potential; and
a drain as the output terminal.

7. The signal transmission circuit according to claim 1, wherein the second reference potential fixing circuit comprises:
a third transistor comprising;
a gate as the input terminal; and
a source fixed to a predetermined potential;
a fourth switch element comprising;
a source connected to the drain of the third transistor;
a drain, wherein the second control pulse is supplied; and
a gate, wherein the drain and the gate are connected; and
a fourth transistor comprising;
a gate connected to the drain of the third transistor;
a source fixed to a predetermined potential; and
a drain as the output terminal.

8. The signal transmission circuit according to claim 1, further comprising:
a first sample hold circuit, comprising an input terminal to which the input signal is supplied; and an output terminal connected to the input terminal of the first reference potential fixing circuit, for holding the input signal for a predetermined period; and
a second sample hold circuit, comprising an input terminal connected to the source of the first source follower; and an output terminal connected to the input terminal of the second reference potential fixing circuit, for holding the signal from the first source follower for a predetermined period; wherein the first and the second reference potential fixing circuits comprise:
a first transistor comprising;
a gate as the input terminal of the reference potential fixing circuit; and
a source fixed to a predetermined potential;
a depletion transistor comprising;
a drain to which a power supply voltage is supplied;
a gate; and
a source, wherein the gate and the source are connected to a drain of the first transistor; and
a second transistor comprising;
a gate connected to the drain of the first transistor; and
a source fixed to a predetermined potential; and
a drain as the output terminal of the reference potential fixing circuit.

9. The signal transmission circuit according to claim 1, further comprising:
a first sample hold circuit, comprising an input terminal to which the first input signal is supplied and an output terminal connected to the input terminal of the first reference potential fixing circuit, for holding the first input signal for a predetermined period; and
a second sample hold circuit, comprising an input terminal connected to the source of the first source follower and an output terminal connected to the input terminal of the second reference potential fixing circuit, for holding the signal from the first source follower for a predetermined period; wherein, the first sample hold circuit is a transistor comprising:
a gate which the first control pulse is supplied to;
a drain; and a source, wherein one of the drain and the source is the input terminal of the first sample hold circuit while the other of the drain and the source is the output terminal of the first sample hold circuit; and the second sample hold circuit is a transistor comprising; a gate which the second control pulse is supplied to;
a drain; and
a source, wherein one of the drain and the source is the input terminal of the second sample hold circuit while the other of the drain and the source is the output terminal of the second sample hold circuit.

10. The signal transmission circuit according to claim 1, further comprising:
a first sample hold circuit, comprising an input terminal to which the first input signal is supplied and an output terminal connected to the input terminal of the first reference potential fixing circuit, for holding the input signal for a predetermined period; and
a second sample hold circuit, comprising an input terminal connected to the source of the first source follower and an output terminal connected to the input terminal of the second reference potential fixing circuit, for holding the signal from the first source follower for a predetermined period; wherein, the first and the second sample hold circuits comprises:
a transistor comprising:
a drain as the input terminal of the sample hold circuit;
a gate connected to the drain; and
a source as the output terminal of the sample hold circuit; and
a switch element, wherein a potential of the source of the transistor is controlled and fixed to the reference potential, referring to an input signal from the corresponding first and second sample hold circuits of a subsequent stage.

* * * * *